United States Patent
Gellrich et al.

(10) Patent No.: US 7,649,702 B2
(45) Date of Patent: Jan. 19, 2010

(54) IMMERSION LITHOGRAPHY OBJECTIVE

(75) Inventors: Bernhard Gellrich, Aalen (DE); Paul Graeupner, Aalen (DE); Juergen Fischer, Heidenheim (DE); Andreas Wurmbrand, Aalen-Reichenbach (DE); Bauke Jansen, Deurne (NL); Bob Streefkerk, Tilburg (NL); Christiaan Alexander Hoogendam, Westerhoven (NL); Johannes Jacobus Matheus Baselmans, Oirschot (NL)

(73) Assignees: Carl Zeiss SMT AG (DE); ASML Netherlands B.V. (NL)

( * ) Notice: Subject to any disclaimer, the term of this patent is extended or adjusted under 35 U.S.C. 154(b) by 0 days.

(21) Appl. No.: 12/019,830

(22) Filed: Jan. 25, 2008

(65) Prior Publication Data

US 2008/0212211 A1 Sep. 4, 2008

Related U.S. Application Data

(63) Continuation of application No. PCT/EP2006/008073, filed on Aug. 16, 2006.

(60) Provisional application No. 60/708,810, filed on Aug. 16, 2005.

(51) Int. Cl.
  G02B 7/02 (2006.01)
  G02B 3/00 (2006.01)
  G02B 3/12 (2006.01)
(52) U.S. Cl. .................. 359/819; 359/649; 359/665
(58) Field of Classification Search ......... 359/649–651, 359/665, 666, 819; 355/30–33; 353/10
  See application file for complete search history.

(56) References Cited

U.S. PATENT DOCUMENTS

| 4,733,945 | A | 3/1988 | Bacich ..................... 359/819 |
| 6,191,898 | B1 | 2/2001 | Trunz et al. ............... 359/819 |
| 6,198,576 | B1 * | 3/2001 | Matsuyama ............... 359/649 |
| 2001/0039126 | A1 | 11/2001 | Ebinuma et al. ........... 438/795 |
| 2002/0021503 | A1 | 2/2002 | Osterried ................ 359/819 |
| 2002/0167740 | A1 | 11/2002 | Osterried et al. .......... 359/819 |
| 2003/0234918 | A1 | 12/2003 | Watson ...................... 355/53 |
| 2005/0068499 | A1 * | 3/2005 | Dodoc et al. ............... 353/10 |
| 2005/0286146 | A1 | 12/2005 | Schletterer ............... 359/819 |

FOREIGN PATENT DOCUMENTS

| EP | 0 023 243 A1 | 2/1981 |
| EP | 1 081 521 A2 | 3/2001 |
| EP | 1 279 984 | 1/2003 |
| EP | 1 503 244 | 2/2005 |
| WO | WO 2004/086148 | 10/2004 |

* cited by examiner

Primary Examiner—Mohammed Hasan
(74) Attorney, Agent, or Firm—GrayRobinson, P.A.

(57) ABSTRACT

An immersion lithography objective has a housing in which at least one first optical element is arranged, a second optical element, which follows the first optical element in the direction of the optical axis of the objective, an immersion medium that adjoins the second optical element being located downstream of the latter in the direction of the optical axis, and a retaining structure for the second optical element. The retaining structure has a greater stiffness in the direction of the optical axis than in a direction perpendicular to the optical axis.

10 Claims, 2 Drawing Sheets

# IMMERSION LITHOGRAPHY OBJECTIVE

CROSS-REFERENCE TO RELATED APPLICATIONS

This application is a continuation of, and claims priority under 35 U.S.C. §120 to, international application serial number PCT/EP2006/008073, filed Aug. 16, 2006, which claims priority to U.S. Ser. No. 60/708,810, filed Aug. 16, 2005. These applications are hereby incorporated by reference.

FIELD

The disclosure relates to an immersion lithography objective having a housing in which at least one first optical element is arranged, and having a second optical element that follows the first optical element in the direction of the optical axis of the objective.

BACKGROUND

Immersion lithography is known. The immersion medium can be matched to an optical element, which is the last one in the direction of the beam path through the immersion lithography objective, that is to say in the event of deformations or movements of this last optical element the immersion medium follows the same facing surface of the optical element. Since the refractive index of the immersion medium and of the last optical element are mostly similar, the errors of the last optical element are to be interpreted as polishing errors of the matchings in the event of deformations, as wedginess errors of a lens in the event of instances of tilting, and as central thickness errors of a lens in the event of a displacement along the optical axis.

Such deformations or displacements of the last optical element along the optical axis, as well as instances of tilting of the element can be caused, in particular, by dynamic changes in the ambient conditions. Thus, for example, pressure changes in the surroundings relative to the gas pressure in the interior of the objective can effect a movement of the last optical element. Such a pressure change can even be caused by opening a door in the room in which the lithography objective is standing. Above all, when relatively quick or short term changes are involved, a control system present at the objective may be incapable of undertaking regulation designed to enable the last optical element otherwise to retain its exact position.

Furthermore, even slight movements in position of the wafer, which is arranged opposite the last optical element, or the high speeds of the element as it is being adjusted can lead to dynamic pressure variations within the immersion medium that influence the position of the last optical element in turn.

This can be a particular problem when such changes in position of the last optical element occur during the exposure, since this can give rise to imaging errors that are mostly not tolerable. For this reason, positional errors of the last optical element should be avoided or greatly limited, as far as possible.

SUMMARY

In one aspect, the disclosure provides an immersion lithography objective that includes a first optical element and a second optical element following the first optical element in a direction along an optical axis of the objective. The objective also includes an immersion medium adjoining the second optical element and downstream of the second optical element in the direction along the optical axis of the objective. The objective further includes a retaining structure configured to retain the second optical element. The stiffness of the retaining structure in the direction along the optical axis of the objective is at least four times the stiffness of the retaining structure in a direction perpendicular to the optical axis.

In another aspect, the disclosure provides a projection exposure machine that includes an illumination system and the immersion lithography objective described in the preceding paragraph.

In a further aspect, the disclosure features a method that includes producing semiconductor components using the machine described in the preceding paragraph.

In some embodiments, the disclosure provides an immersion lithography objective in which the position of the last optical element undergoes no change or only a very slight change due to external influences, while at the same time providing adequate compensation for any possible thermal expansion of the last optical element.

In certain embodiments, the disclosure provides an immersion lithography objective having a housing in which at least one first optical element is arranged, having a second optical element, which follows the first optical element in the direction of the optical axis of the objective, an immersion medium that adjoins the second optical element being located downstream of the latter in the direction of the optical axis, and having a retaining structure for the second optical element, wherein the retaining structure has a greater stiffness in the direction of the optical axis than in a direction perpendicular to the optical axis.

The greater stiffness of the retaining structure in the direction of the optical axis by comparison with the stiffness in a direction perpendicular to the optical axis can ensure that in the direction of the optical axis. That is to say in the direction in which displacements of the last optical element constitute a particular impairment during the exposure of the wafer, the last optical element can be held very stiffly such that any possible force acting on the last optical element can lead to only a very slight axial movement of the element. By contrast, the lesser stiffness of the retaining structure in the direction perpendicular to the optical axis can permit an expansion of the last optical element in influence, for example, by thermal effects.

A desired relationship between the stiffness in the direction of the optical axis and the stiffness in the direction perpendicular to the optical axis is that the stiffness of the retaining structure in the direction of the optical axis is at least four times the stiffness in the direction perpendicular to the optical axis. Such a relationship can be regarded sufficient for most cases.

However, better results in respect of an adequate compensation for the thermal expansion of the last optical element are achieved, if the stiffness of the retaining structure in the direction of the optical axis is at least forty times the stiffness in the direction perpendicular to the optical axis.

Even better results can be achieved, if the stiffness of the retaining structure in the direction of the optical axis is at least four hundred times the stiffness in the direction perpendicular to the optical axis.

It has proved to be particularly advantageous with regard to a slight change in position of the last optical element in the direction of the optical axis when the retaining structure has a stiffness of at least $10^7$ N/m in the direction of the optical axis. Given the effect of a maximum force to be expected, this leads to a maximum movement of the last optical element of approximately 10 nm in the direction of the optical axis.

It can be provided, in addition, that the retaining structure has at least one decoupling element that is elastic in a direction perpendicular to the optical axis. Such an elastic decoupling element can advantageously improve the possibility for thermal expansion of the last optical element, in this case in the radial direction of the optical element.

In some embodiments, the disclosure provides a projection exposure machine having an illumination system and having an inventive immersion lithography objective for producing semiconductor components as described herein. In certain embodiments, the disclosure provides a method for producing semiconductor components by using such a projection exposure machine.

BRIEF DESCRIPTION OF THE DRAWINGS

The disclosure may be better understood based on the description below as well as the figures, in which.

DETAILED DESCRIPTION

Figure 1:
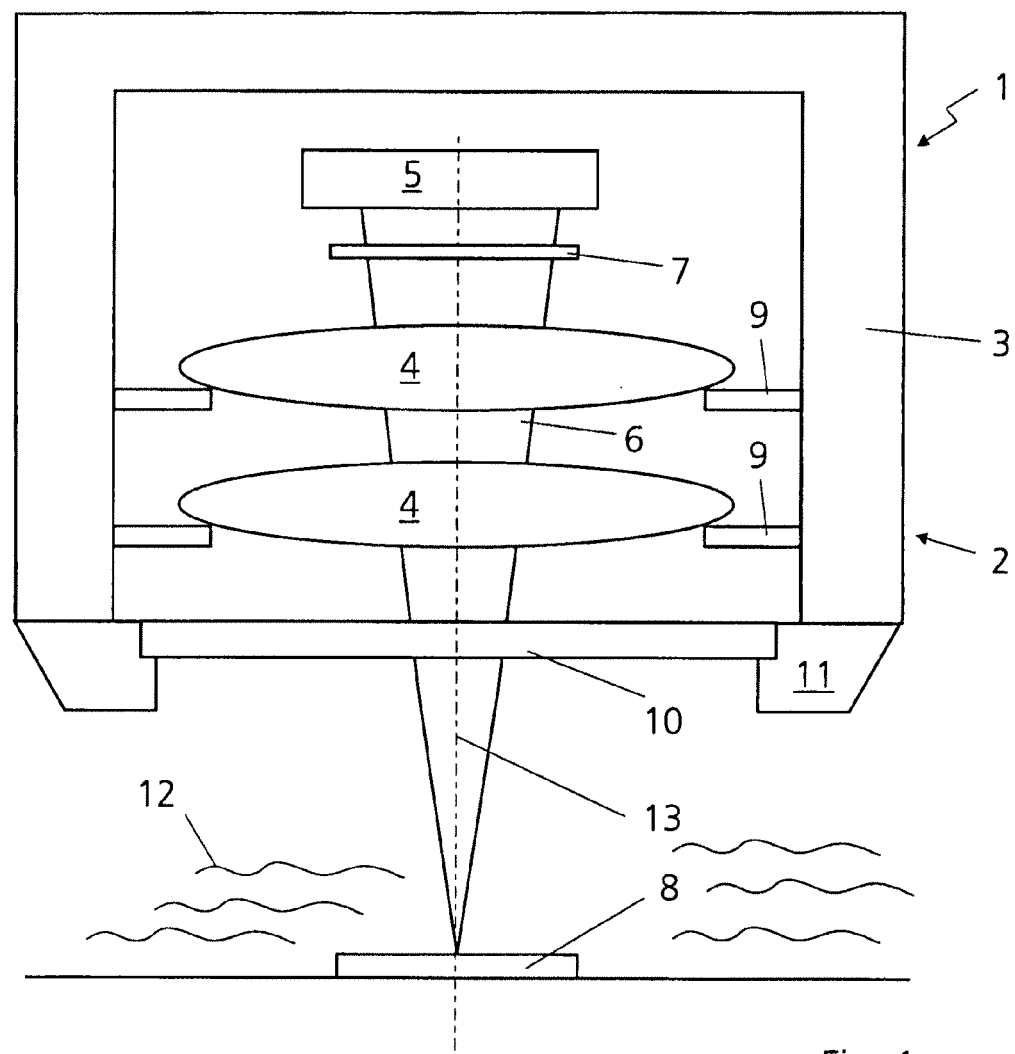
FIG. 1 shows a schematic view of a projection exposure machine.

FIG. 1 shows a schematic view of a projection exposure machine 1 having an immersion lithography objective 2 that has a housing 3 in which a number of optical elements 4 are arranged. The projection exposure machine 1 also has at its top side a light source or an illumination system 5 that transmits a beam path 6 through the immersion lithography objective 2 and with the aid of which a reticle 7 arranged directly downstream of the illumination system 5 is imaged in a way known per se onto a wafer 8 located below the immersion lithography objective 1. Semiconductor components are produced in a way likewise known per se by the exposure of the wafer 8 via the projection exposure machine 1.

Arranged downstream in the direction of the beam path 6 of the optical elements 4 specified above, which are held via respective mounts 9 in the housing 3, is a second or last optical element 10, which is fitted on the housing 3 via a retaining structure 11. The last optical element 10, which can also be denoted as terminal element given that it is the optical element situated closest to the wafer 8 can be connected to the retaining structure 11 both rigidly and also exchangeably. Located between the last optical element 10 and the wafer 8 is an immersion medium 12 that adjoins the second optical element 10 and covers the wafer 8. Any suitable fluid, for example water, can be used as immersion medium 12.

In order to prevent even slight forces that act on the immersion lithography objective 2 and can be caused, for example, by pressure changes in the surroundings of the immersion lithography objective 2, from leading to undesirably large changes in position, in particular axial movements, that is to say movements along an optical axis 13 of the immersion lithography objective 2, the retaining structure 11 has a greater stiffness in the direction of the optical axis 13 than in a direction or plane perpendicular to the optical axis 13. The stiffness of the retaining structure 11 in the direction of the optical axis 13, that is to say in the axial direction, can be at least $10^7$ N/m, while the stiffness of the retaining structure 11 in the direction perpendicular to the optical axis 13, that is to say in the radial direction, can fall in the region of approximately $10^6$ N/m or in a region stated below.

More particularly, the stiffness of the retaining structure 11 in the direction of the optical axis 13 can be at least four times the stiffness of the retaining structure 11 in the direction perpendicular to the optical axis 13. This means that, given that the stiffness in the axial direction is $10^7$ N/m, the stiffness of the retaining structure 11 in the direction perpendicular to the optical axis 13 would be $2.5 \times 10^6$ N/m. Furthermore, the stiffness of the retaining structure 11 in the direction of the optical axis 13 can be at least forty times the stiffness in the direction perpendicular to the optical axis 13, which would hence be $2.5 \times 10^5$ N/m. The relationship between the stiffness of the retaining structure 11 in the direction of the optical axis 13 can be as much as at least four hundred times the stiffness in the direction perpendicular to the optical axis 13, which would then be $2.5 \times 10^4$ N/m. Of course, the stiffness of the retaining structure 11 in the direction of the optical axis 13 can differ from the above mentioned at least $10^7$ N/m with the given relationships remaining and the stiffness of the retaining structure 11 in the direction perpendicular to the optical axis 13 changing.

The reason for the stiffness in the direction perpendicular to the optical axis 13 being less than the stiffness in the direction of the optical axis 13, is to permit the last optical element 10 to move in the case of temperature fluctuations in this plane perpendicular to the optical axis 13, in particular to expand or to contract.

Figure 2:
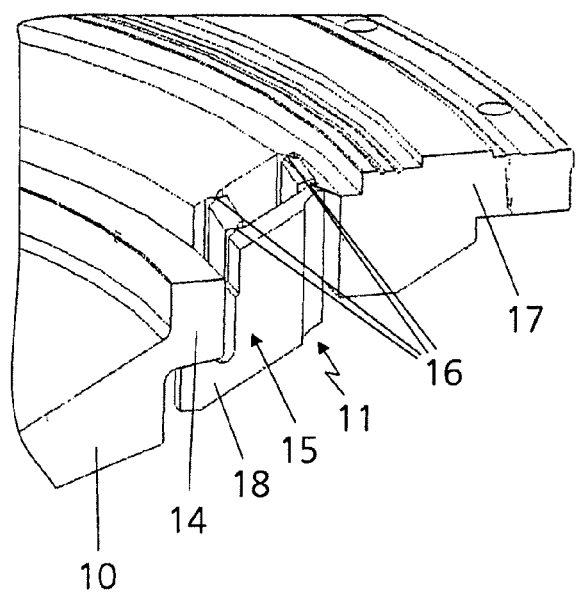
FIG. 2 shows a perspective view of a retaining structure.
Figure 3:
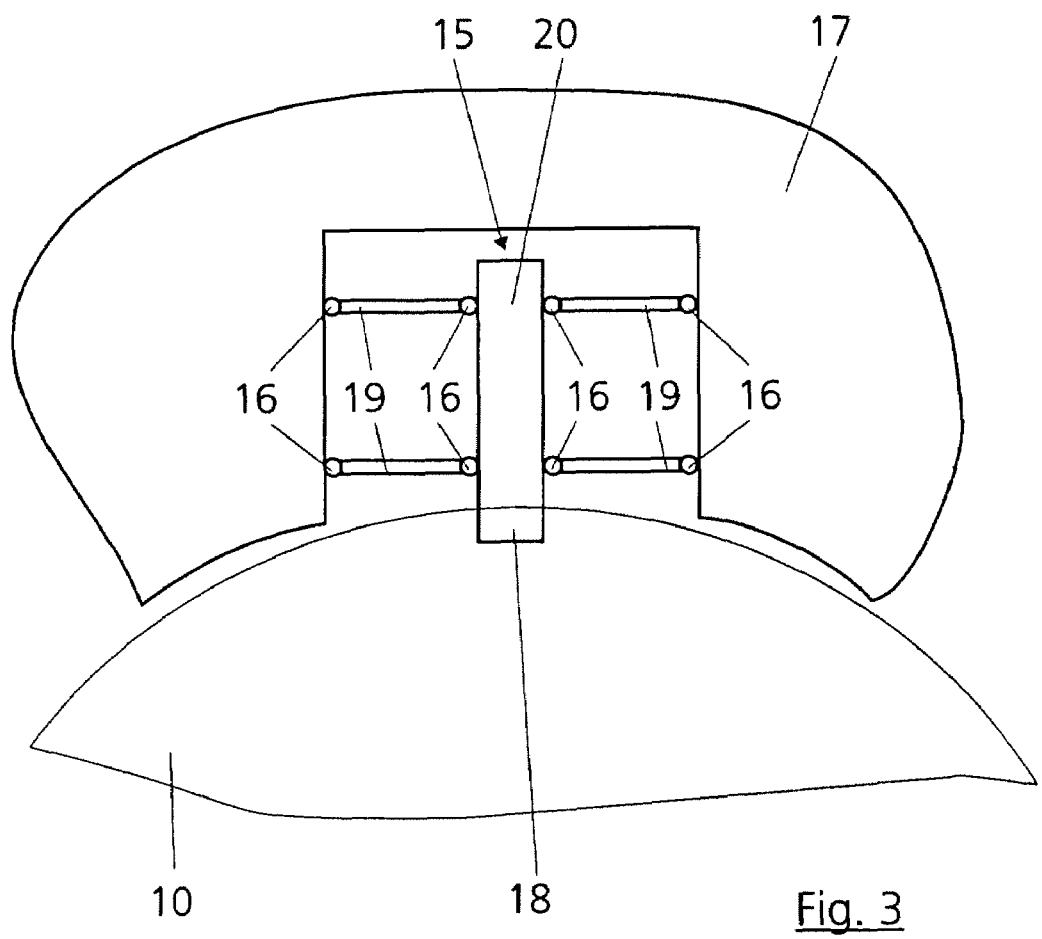
FIG. 3 shows a schematic top view of the retaining structure according to FIG. 2.

An embodiment of the retaining structure 11 that is to be regarded merely as exemplary is illustrated in FIGS. 2 and 3 and is capable of achieving the stiffnesses for the purpose of fitting the last optical element 10. In this case, the last optical element 10 has on its outer edge a stiffening ring 14 that bears against a connecting element 15. It suffices when a total of three connecting elements 15 are provided in the plane perpendicular to the optical axis 13, but it is also possible to provide a larger number of connecting elements 15. Usually, the connecting elements 15 are generally parallel to the stiffening ring 14.

The connecting element 15, which is of relatively large overall height and therefore extremely stiff in the direction of the optical axis 13, is provided, for its part, with radially yielding or elastic decoupling elements 16 that ensure the lesser stiffness of the retaining structure 11 in the radial direction, that is to say in the direction or plane perpendicular to the optical axis 13. The decoupling elements 16 can be regarded as joints or as relatively thin parts of the connecting elements 15 that assure the thermal expansion of the last optical element 10.

The retaining structure 11 also has an outer ring 17, which has a coefficient of thermal expansion differing from the last optical element 10, and which can consist, for example, of ceramic or titanium, but also of aluminum, steel or brass. In order to permit an optimal movement in the radial direction of the last optical element 10, which can be, for example, calcium fluoride or of silicon oxide, the elastic decoupling elements 16 are arranged in the transitional region between the materials having the different coefficients of thermal expansion, that is to say between the last optical element 10 and the outer ring 17. In the embodiment of FIGS. 2 and 3, the connecting element 15 is an integral part with the outer ring 17 or, with other words, the stiffening ring 14 and the outer ring 17 are monolithic. Furthermore, the last optical element 10 rests on respective noses 18 of the connecting elements 15.

From the top view of FIG. 3 it can be seen that each connecting element 15 consists of two pairs of parallel bars 19, which are connected to a central element 20 that comprises the nose 18 on which the last optical element 10 rests. Each of the bars 19 is coupled on one end to the outer ring 17 and on the other end to the central element 20 via a respective decoupling element 16. This means that each connecting element 15 comprises eight joints or decoupling elements 16.

Figure 4:
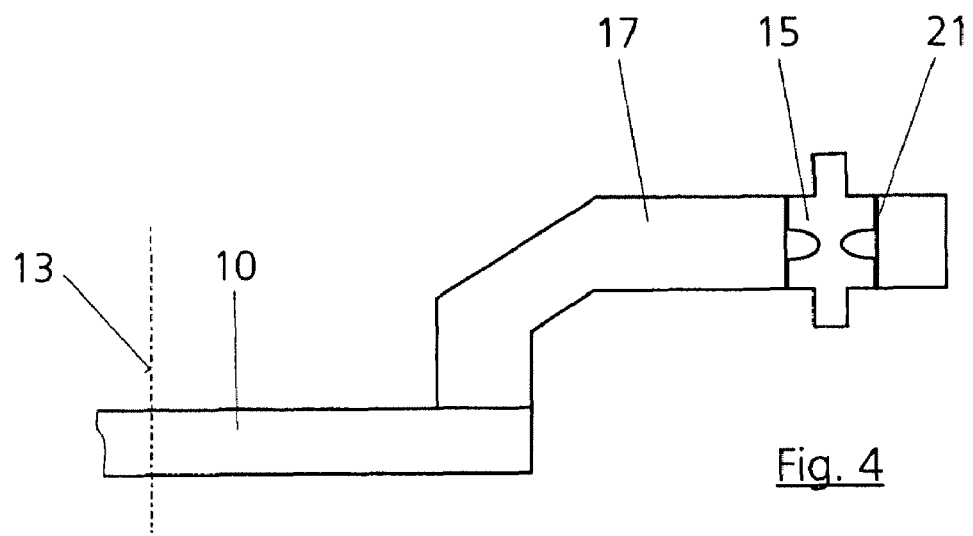
FIG. 4 shows a side view of a retaining structure.

In FIG. 4, the retaining structure 11 also comprises the outer ring 17, which can be joined to the last optical element 10 by soldering or wringing. The outer ring 17 comprises on each circumference three holes 21, in which respective connecting elements 15 to connect the outer ring 17 with the housing 3 are contained. While these connecting elements are extremely stiff in the direction of the optical axis 13, they comprise a rather weak portion forming the elastic decoupling element, which ensures the lesser stiffness of the retaining structure 11 in the radial direction to provide the possibility of a thermal extension of the last optical element 10 and the retaining structure 11.

Instead of the illustrated embodiments of the retaining structure 11, the latter can also have, for example, a number of hexapods that are relatively stiff in the direction of the optical axis 13 and relatively elastic in the plane perpendicular to the optical axis 13.

What is claimed is:

1. An objective, comprising:
    a first optical element;
    a second optical element following the first optical element in a direction along an optical axis of the objective;
    an immersion medium adjoining the second optical element and downstream of the second optical element in the direction along the optical axis of the objective; and
    a retaining structure configured to retain the second optical element,
    wherein a stiffness of the retaining structure in the direction along the optical axis of the objective is at least four times a stiffness of the retaining structure in a direction perpendicular to the optical axis, and the objective is an immersion lithography objective.

2. The objective of claim 1, wherein the stiffness of the retaining structure in the direction along the optical axis is at least forty times the stiffness of the retaining structure in the direction perpendicular to the optical axis.

3. The objective of claim 1, wherein the stiffness of the retaining structure in the direction along the optical axis is at least four hundred times the stiffness of the retaining structure in the direction perpendicular to the optical axis.

4. The objective of claim 1, wherein the retaining structure has a stiffness of at least $10^7$ N/m in the direction along the optical axis.

5. The objective of claim 1, wherein the retaining structure has at least one decoupling element that is elastic in the direction perpendicular to the optical axis.

6. The objective of claim 5, wherein at least a subregion of the retaining structure and the second optical element have different coefficients of thermal expansion, and the at least one elastic decoupling element is arranged in a region between the second optical element and the subregion of the retaining structure.

7. The objective of claim 5, wherein the retaining structure has at least has three decoupling elements, each of the three decoupling elements being elastic in the direction perpendicular to the optical axis.

8. A machine, comprising:
    an illumination system; and
    the immersion lithography objective of claim 1,
    wherein the machine is a projection exposure machine.

9. The machine of claim 8, wherein the machine is configured to produce semiconductor components.

10. A method, comprising:
    producing semiconductor components using the machine of claim 8.

* * * * *